(12) United States Patent
Lin et al.

(10) Patent No.: US 8,779,519 B1
(45) Date of Patent: Jul. 15, 2014

(54) SEMICONDUCTOR DEVICE HAVING TWO-WAY CONDUCTION CHARACTERISTICS, AND ELECTROSTATIC DISCHARGE PROTECTION CIRCUIT INCORPORATING THE SAME

(71) Applicant: Ili Technology Corporation, Jhubei (TW)

(72) Inventors: Wei-Yao Lin, Zhudong Township, Hsinchu County (TW); Chung-Wei Wang, Zhubei (TW); Yu-Lun Lu, Zhuangwei Township, Yilan County (TW); Kuo-Ko Chen, Bade (TW)

(73) Assignee: Ili Technology Corporation, Jhubei, Hsinchu County (TW)

( * ) Notice: Subject to any disclaimer, the term of this patent is extended or adjusted under 35 U.S.C. 154(b) by 0 days.

(21) Appl. No.: 13/742,527

(22) Filed: Jan. 16, 2013

(51) Int. Cl.
*H01L 23/62* (2006.01)
(52) U.S. Cl.
USPC ........... 257/355; 257/360; 257/391; 257/392; 257/487; 257/546

(58) Field of Classification Search
USPC .................. 257/391, 392, 355, 360, 487, 546
See application file for complete search history.

(56) References Cited

U.S. PATENT DOCUMENTS 6,399,990 B1 * 6/2002 Brennan et al. ............... 257/355
6,538,266 B2 * 3/2003 Lee et al. ...................... 257/173

* cited by examiner

*Primary Examiner* — Tan N Tran
(74) *Attorney, Agent, or Firm* — Nixon & Vanderhye P.C.

(57) ABSTRACT

A semiconductor device includes an n-type first doped region for receiving an external voltage, an n-type second doped region and a p-type third doped regions all formed in a p-type substrate, and is configured to have a first threshold voltage for forward conduction between the first and second doped regions, and a second threshold voltage for forward conduction between the first and third doped regions. A current is drained by flowing through the first doped region, the substrate and the second doped region if the external voltage is greater than the first threshold voltage or by flowing through the third doped region, the substrate and the first doped region if the external voltage is less than the second threshold voltage.

13 Claims, 13 Drawing Sheets

SEMICONDUCTOR DEVICE HAVING TWO-WAY CONDUCTION CHARACTERISTICS, AND ELECTROSTATIC DISCHARGE PROTECTION CIRCUIT INCORPORATING THE SAME

1. FIELD OF THE INVENTION

The invention relates to an electrostatic discharge protection circuit, and more particularly to a semiconductor device having the same.

2. DESCRIPTION OF THE RELATED ART

In general, electrostatic discharge (ESD) protection circuits for protecting internal circuits from static electricity introduced from outside are provided at input/output pads of semiconductor devices.

Referring to FIG. 1, a conventional ESD protection circuit 11, which is connected electrically to a main circuit 10 including at least one transistor (not shown) and to an input/output pad 12 transmitting an electrical signal to/from the main circuit 10, is shown to include first and second diodes 13', 13" serving as unidirectional conduction electrical element, and a normally-off n-type field effect transistor (FET) 14 serving as a clamp unit and coupled between a power source ($V_{DD}$) and ground (GND) for prohibiting conduction between the power source ($V_{DD}$) and ground (GND). Thus, a current resulting from conduction between the power source ($V_{DD}$) and ground (GND) cannot be generated, thereby avoiding damage to the elements of the main circuit 10 due to overheating in response to a short circuit.

Referring further to FIG. 2, a semiconductor device having the conventional ESD protection circuit 11 is shown to include a substrate 15, and the first and second diodes 13', 13" and the n-type FET 14 formed in the substrate 15.

The first diode 13' includes a p-type well region 131, an n-type doped region 132 formed in the P-type well region 131, a p-type doped region 133, and an insulating spacer block 137 formed between the n-type doped region 132 and the p-type doped region 133. The doping concentration of the p-type doped region 133 is higher than that of the p-type well region 131.

The second diode 13" includes an n-type well region 134, a p-type doped region 136 formed in the n-type well region 134, an n-type doped region 135, and an insulating spacer block 138 formed between the p-type doped region 136 and the n-type doped region 135. The doping concentration of the n-type doped region 135 is higher than that of the n-type well region 134.

The n-type FET 14 includes a p-type well region 141, n-type source and drain regions 142, 143 formed in the p-type well region 141, a gate electrode 144 formed on the substrate 15, disposed above the source and drain regions 142, 143 and spaced apart from the source and drain regions 142, 143 by an insulating layer (not shown), wherein the drain region 143, the p-type well region 141 and the source region 142 constitute a parasitic bipolar transistor of the n-type FET 14.

The n-type doped region 132 of the first diode 13' and the p-type doped region 136 of the second diode 13" are connected electrically to the input/output pad 12. The n-type doped region 135 of the second diode 13" and the drain region 143 of the n-type FET 14 are connected electrically to the power source ($V_{DD}$). The p-type doped region 133 of the first diode 13', and the source region 142 and the gate electrode 144 of the n-type FET 14 are connected electrically to ground (GND).

When the main circuit 10 receives a predetermined supply voltage from the power source ($V_{DD}$), and an electrical signal from the input/output pad 12, static electricity accumulated in the input/output pad 12 forms a positive electrostatic accumulated voltage or a negative electrostatic accumulated voltage.

When the positive electrostatic accumulated voltage is greater than a sum of a conduction voltage of the second diode 13" and a conduction voltage of the parasitic bipolar transistor of the n-type FET 14, the second diode 13" and the parasitic bipolar transistor of the n-type FET 14 conduct such that the positive electrostatic accumulated voltage is released to ground (GND) through the second diode 13" and the parasitic bipolar transistor of the n-type FET 14.

When the negative electrostatic accumulated voltage is less than a conduction voltage of the first diode 13', the first diode 13' conducts such that the negative electrostatic accumulated voltage is released to ground (GND) through the first diode 13'.

As illustrated, static electricity will not be transmitted to the main circuit 10, thereby avoiding damage to the main circuit 10 due to static electricity. However, the discharge path provided for the positive electrostatic accumulated voltage is longer compared to the negative electrostatic accumulated voltage, thereby resulting in a longer discharge time period. In addition, it is noted that the positive electrostatic accumulated voltage is regarded as a reverse bias voltage for the first diode 13'. As such, when the positive electrostatic accumulated voltage (i.e., a voltage applied to the n-type doped region 132 of the first diode 13') is higher than a reverse breakdown voltage of the first diode 13', burnout may occur in the n-type doped region and/or the insulating spacer block adjacent to the same, as shown in FIG. 3, because the high positive electrostatic accumulated voltage cannot be fast released, thereby resulting in ESD protection failure.

In order to reduce the occurrence of burnout, a field oxide diode (FOD) disclosed in Taiwanese Patent No. 485595 is used to substitute the second diode 13'. In addition, a junction area between the n-type and p-type doped regions is increased by increasing the depth of one of the n-type and p-type doped regions to reduce charge density, thereby raising a reverse breakdown voltage of the FOD. As a result, the occurrence of burnout is reduced. However, since increasing of the junction area is limited, ESD protection still cannot be ensured. Therefore, improvements may be made to the above techniques.

SUMMARY OF THE INVENTION

Therefore, an object of the present invention is to provide an electrostatic discharge protection circuit, and a semiconductor device having the same that can overcome the aforesaid drawbacks of the prior art.

According to one aspect of the present invention, a semiconductor device of the present invention comprises:

a substrate;

a first doped region formed in the substrate and adapted to receive an external voltage;

a second doped region formed in the substrate and connected to ground; and a third doped region formed in the substrate and connected to ground.

Each of the substrate and the third doped region is doped with a first type dopant, and each of the first and second doped regions is doped with a second type dopant such that the semiconductor device is configured to have a first threshold voltage for forward conduction between the first and second doped regions, and a second threshold voltage for forward conduction between the first and third doped regions.

When the first type dopant and the second type dopant are respectively a p-type dopant and an n-type dopant, if the external voltage is greater than the first threshold voltage, a current is drained by flowing through the first doped region, the substrate and the second doped region, and if the external voltage is less than the second threshold voltage, a current is drained by flowing through the third doped region, the substrate and the first doped region.

When the first type dopant and the second type dopant are respectively an n-type dopant and a p-type dopant, if the external voltage is less than the first threshold voltage, a current is drained by flowing through the second doped region, the substrate and the first doped region, and if the external voltage is greater than the second threshold voltage, a current is drained by flowing through the first doped region, the substrate and the third doped region.

According to another aspect of the present invention, there is provided an electrostatic discharge protection circuit for a main circuit connected electrically to an input/output pad for transmitting an electrical signal to/from the main circuit. The electrostatic discharge protection circuit of the present invention comprises:

a semiconductor device including
a substrate,
a first doped region formed in the substrate and adapted to be connected electrically to the input/output pad to receive an electrostatic accumulated voltage from the input/output pad,
a second doped region formed in the substrate and connected to ground, and
a third doped region formed in the substrate and connected to ground,
each of the substrate and the third doped region being doped with a first type dopant, and each of the first and second doped regions being doped with a second type dopant such that the semiconductor device is configured to have a first threshold voltage for forward conduction between the first and second doped regions, and a second threshold voltage for forward conduction between the first and third doped regions; and
a clamp unit adapted to be coupled between a power source and ground for prohibiting conduction between the power source and ground.

When the first type dopant and the second type dopant are respectively a p-type dopant and an n-type dopant, if the electrostatic accumulated voltage is greater than the first threshold voltage, an electrostatic discharge current is drained by flowing through the first doped region, the substrate and the second doped region of the semiconductor device, and if the electrostatic accumulated voltage is less than the second threshold voltage, an electrostatic discharge current is drained by flowing through the third doped region, the substrate and the first doped region of the semiconductor device.

When the first type dopant and the second type dopant are respectively an n-type dopant and a p-type dopant, if the electrostatic accumulated voltage is less than the first threshold voltage, an electrostatic discharge current is drained by flowing through the second doped region, the substrate and the first doped region of the semiconductor device, and if the electrostatic accumulated voltage is greater than the second threshold voltage, an electrostatic discharge current is drained by flowing through the first doped region, the substrate and the third doped region of the semiconductor device.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
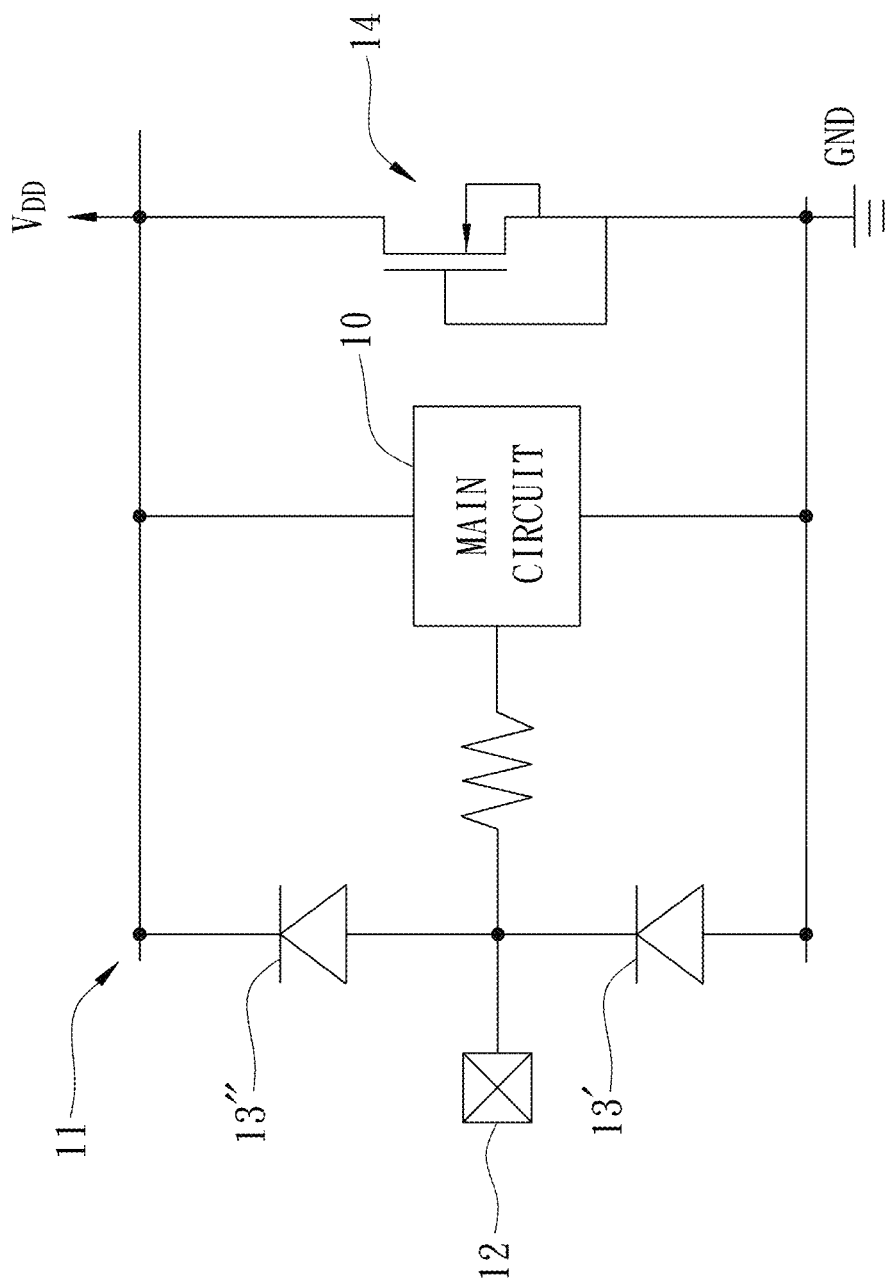
FIG. 1 is an equivalent circuit diagram illustrating a conventional electrostatic discharge protection circuit for a main circuit.

Before the present invention is described in greater detail, it should be noted that like elements are denoted by the same reference numerals throughout the disclosure.

Figure 4:
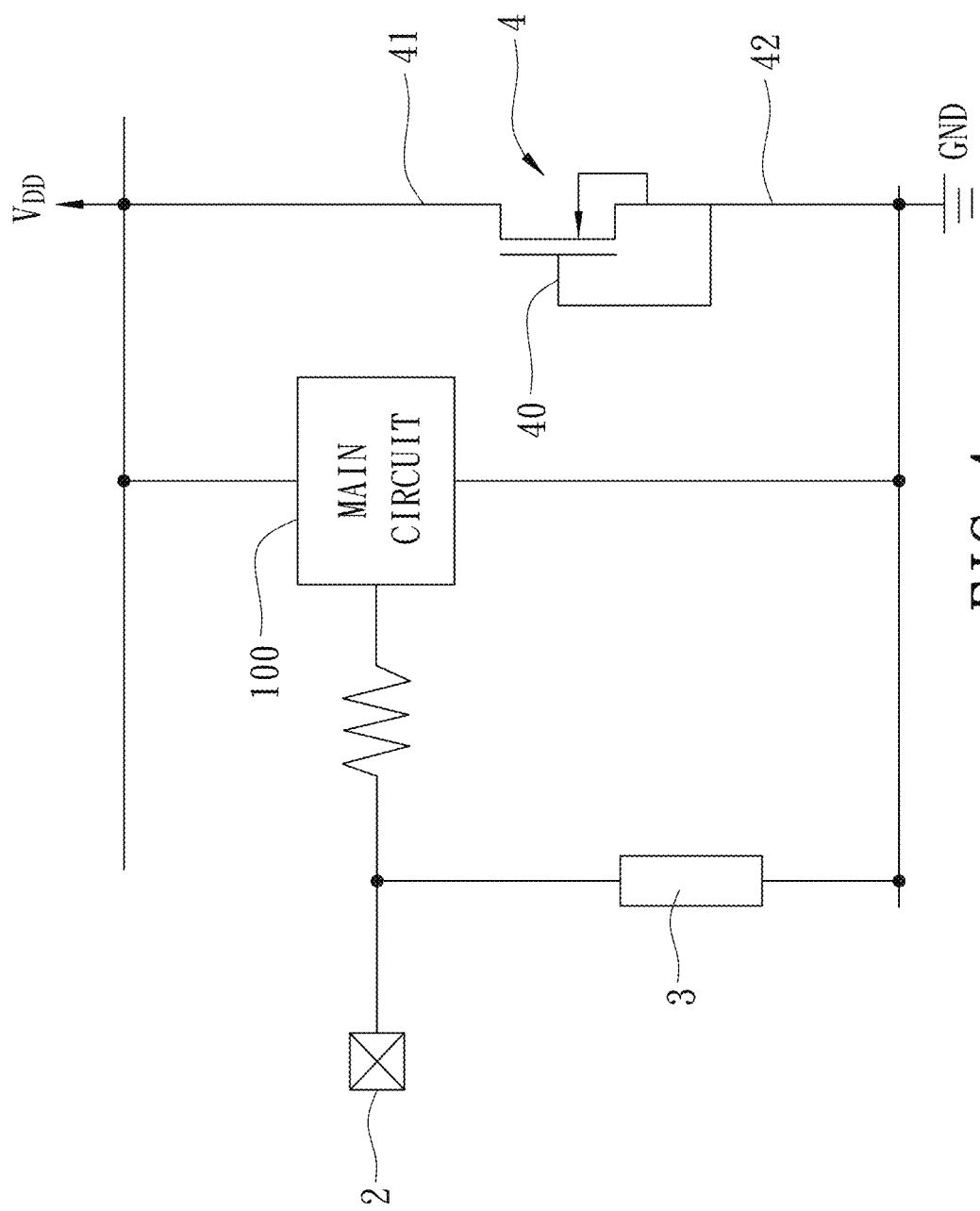
FIG. 4 is an equivalent circuit diagram illustrating the first preferred embodiment of an electrostatic discharge protection circuit for a main circuit according to the present invention.
Figure 5:
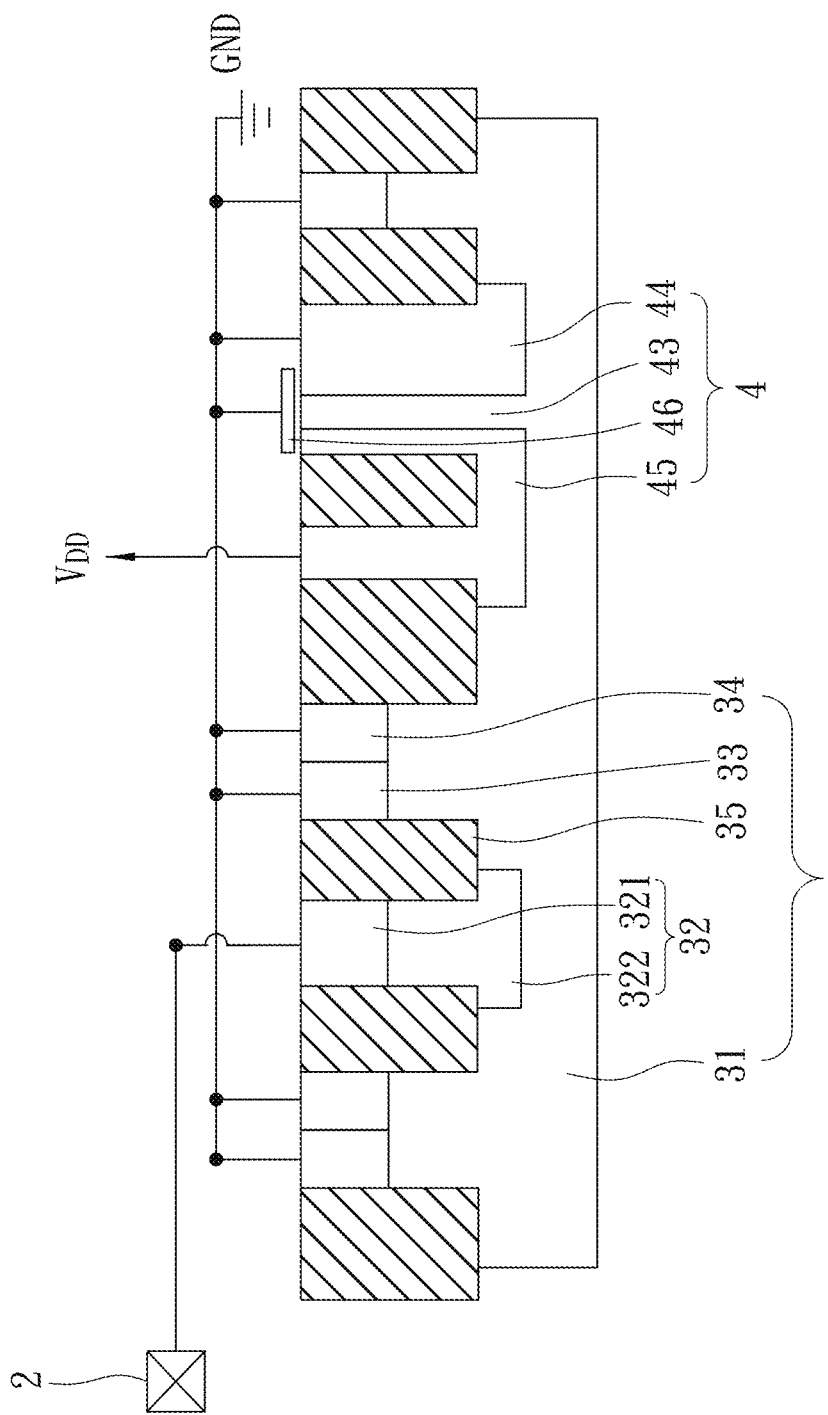
FIG. 5 is a schematic cross sectional view illustrating the first preferred embodiment.

Referring to FIGS. 4 and 5, the first preferred embodiment of an electrostatic discharge protection circuit for a main circuit 100 according to the present invention is shown to include a semiconductor device 3, and a clamp unit. The main circuit 100 is connected electrically to an input/output pad 2 transmitting an electrical signal to/from the main circuit 100, and to a power source ($V_{DD}$) providing a predetermined supply voltage. In this embodiment, the electrostatic discharge protection circuit and the main circuit 100 can be fabricated from a silicon wafer by semiconductor processing.

The semiconductor device 3 includes a substrate 31, a first doped region 32, a second doped region 33, and a third doped region 34, and an insulating spacer block 35. The first, second and third doped regions 32, 33, 34 are formed in the substrate 31 by diffusion or ion implantation.

The substrate 31 is doped with a first type dopant. In this embodiment, a first type semiconductor wafer or a first type well region in a silicon wafer can serve as the substrate 31.

The first doped region 32 is doped with a second type dopant, and is adapted to be connected electrically to the input/output pad 2 such that the first doped region 32 receives from the input/output pad 2 an electrostatic accumulated voltage generated by static electricity accumulated in the input/output pad 2. In this embodiment, the first doped region 32 includes an upper main doped portion 321 extending outward from a top surface of the substrate 31 and adapted to be connected electrically to the input/output pad 2, and a lower secondary doped portion 322 adjacent to the upper main doped portion 321 and having an impurity doping concentration lower than that of the upper main doped portion 321.

The second doped region 33 is doped with a second type dopant, and is adapted to be connected to ground (GND). The second doped region 32 is spaced apart from the first doped region 32.

The insulating spacer block 35 is formed in the substrate 31, and extends downward from the top surface of the substrate 31 for spacing the first and second doped regions 32, 33 apart from each other. In this embodiment, the insulating spacer block 35 is made from an insulating material, for example silica, but it is not limited to this.

The third doped region 34 is doped with a first type dopant, and is adapted to be connected to ground (GND). The third doped region 34 has an impurity doping concentration higher than that of the substrate 31. In this embodiment, the third doped region 34 is adjacent to the second doped region 33.

Figure 6:
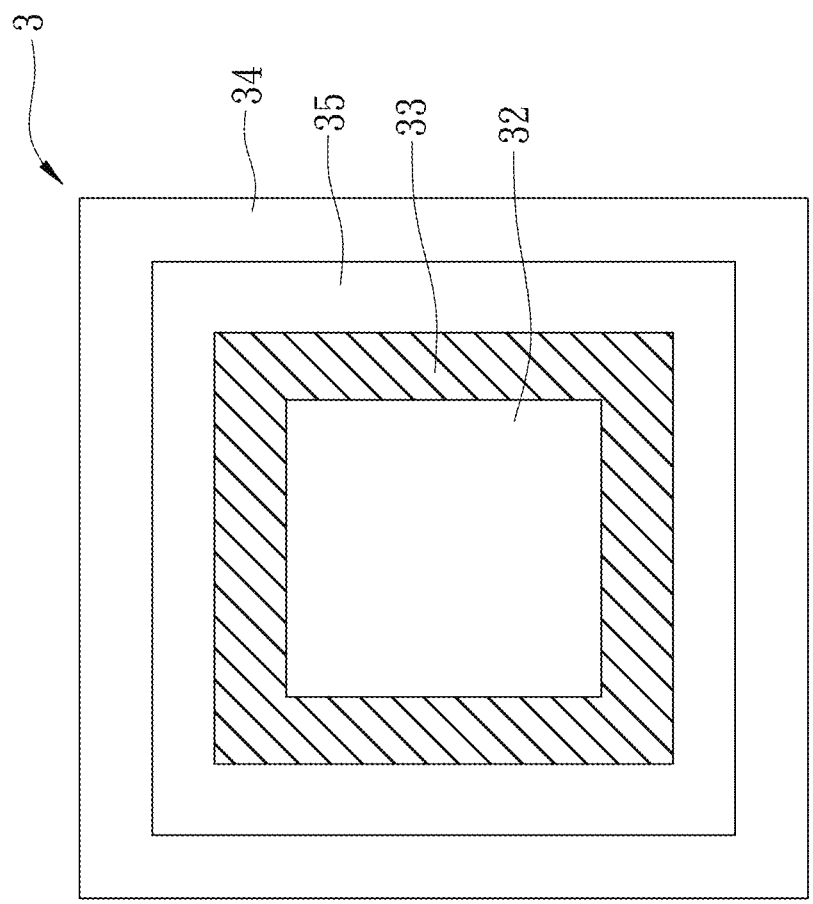
FIG. 6 is a schematic top view showing a semiconductor device of the first preferred embodiment having two-way conduction characteristics.

Referring further to FIG. 6, the first, second and third doped regions 32, 33, 34, and the insulating spacer block 35 extend downward from the top surface of the substrate 31 (see FIG. 5). In addition, the insulating spacer block 35 surrounds the first doped region 32. The second doped region 33 surrounds the insulating spacer block 35. The third doped region 34 surrounds the second doped region 33.

In such a configuration, the first doped region 32, the substrate 31 and the grounded second doped region 33 constitute a bipolar transistor, and the first doped region 32 and the grounded third doped region 34 constitute a diode. It is noted that the semiconductor device 3 is configured to have a first threshold voltage for forward conduction between the first and second doped regions 32, 33, and a second threshold voltage for forward conduction between the first and third doped regions 32, 34.

In this embodiment, each first type dopant is a p-type dopant, and each second type dopant is an n-type dopant (i.e., the substrate 31 is a p-type substrate, the first doped region 32 is an n-type region, the second doped region 33 is an n-type region, and the third doped region is a p-type region). As such, the first threshold voltage is a positive voltage and the second threshold voltage is a negative voltage. In this case, if the electrostatic accumulated voltage applied to the first doped region 32 during transmission of an electrical signal to the main circuit 100 is greater than the positive first threshold voltage (i.e., the bipolar transistor consisting of the first doped region 32, the substrate and the second doped region 33 conducts), an electrostatic discharge current is drained by flowing through the first doped region 32, the substrate 31 and the second doped region 33. If the electrostatic accumulated voltage is less than the negative second threshold voltage, an electrostatic discharge current is drained by flowing through the third doped region 34, the substrate 31 and the first doped region 32.

In other embodiments, each first type dopant can be an n-type dopant, and each second type dopant can be a p-type dopant (i.e., the substrate 31 is an n-type substrate, the first doped region 32 is a p-type region, the second doped region 33 is a p-type region, and the third doped region is an n-type region). As such, the first threshold voltage is a negative voltage and the second threshold voltage is a positive voltage. In this case, if the electrostatic accumulated voltage is less than the negative first threshold voltage (i.e., the bipolar transistor consisting of the first doped region 32, the substrate 31 and the second doped region 33 conducts), an electrostatic discharge current is drained by flowing through the second doped region 33, the substrate 31 and the first doped region 32. If the electrostatic accumulated voltage is greater than the positive second threshold voltage, an electrostatic discharge current is drained by flowing through the first doped region 32, the substrate 31 and the third doped region 34.

As illustrated, since the semiconductor device 3 has two-way conduction characteristics, static electricity accumulated in the input/output pad 2 can be effectively released through the semiconductor device 3 to reduce burnout incurred in the prior art, thereby enhancing electrostatic discharge protection efficiency.

Figure 2:
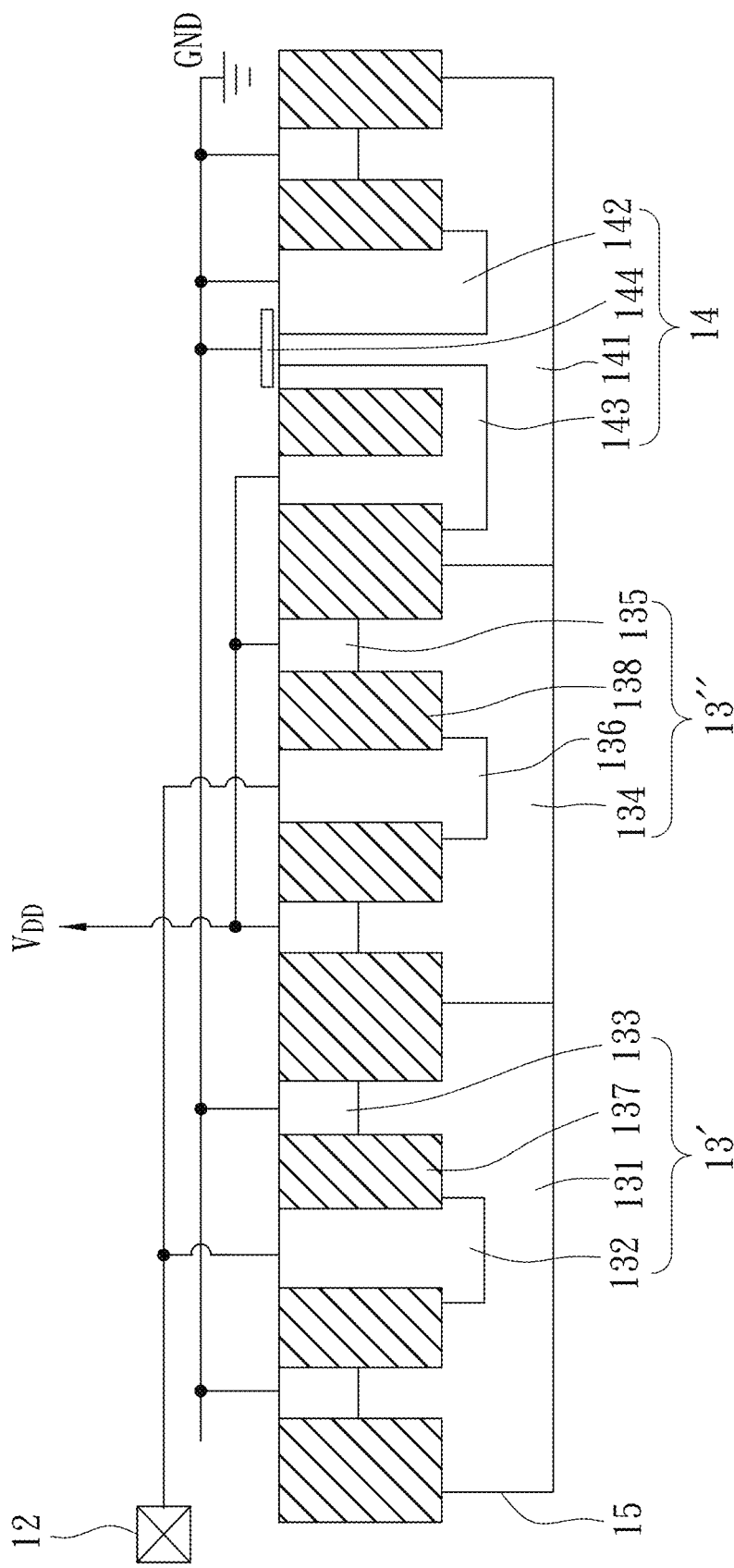
FIG. 2 is a schematic cross sectional view of the conventional electrostatic discharge protection circuit.
Figure 3:
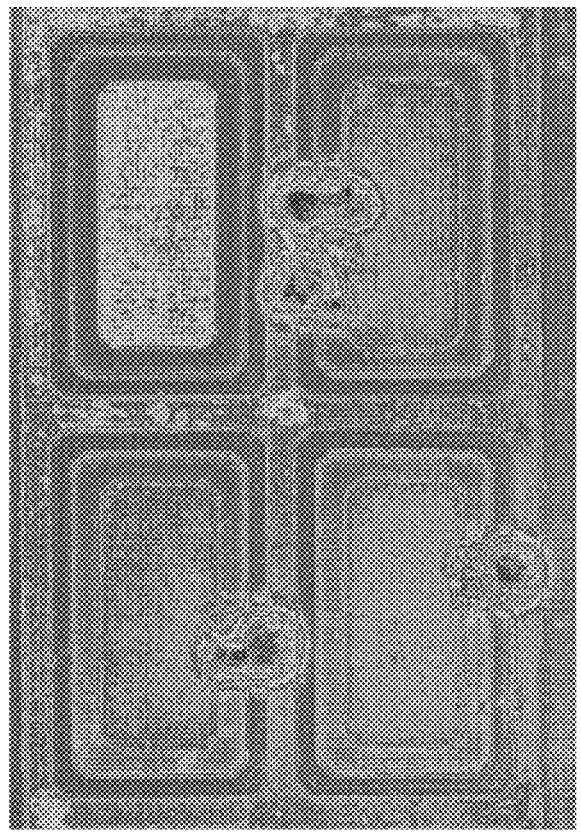
FIG. 3 is a schematic top view illustrating diode burnout occurred in the conventional electrostatic discharge protection circuit.

The clamp unit is adapted to be coupled between the power source ($V_{DD}$) and ground (GND) for prohibiting conduction between the power source ($V_{DD}$) and ground (GND), thereby avoiding damage to the main circuit 100 due to overheating in response to a short circuit. In this embodiment, the clamp unit includes a normally-off n-type field effect transistor (FET) 4, but is not limited to this. The n-type FET 4 has a drain terminal 41 coupled to the power source ($V_{DD}$), a grounded source terminal 42, and a grounded gate terminal 40. As shown in FIG. 5, similar to the n-type FET 14 in FIG. 2, the n-type FET 4 includes a p-type well region 43, a n-type source region 44 formed in the p-type well region 43 by doping, a n-type drain region 45 spaced apart from the n-type source region 44 by a predetermined spacer, and a gate electrode 46 formed on the p-type well region 43, disposed above the n-type source and drain regions 44, 45 and spaced apart from the source and drain regions 44, 45 by an insulating layer (not shown). Similarly, the n-type drain region 45, the p-type well region 43 and the n-type source region 43 constitute an equivalent n-type bipolar transistor.

Figure 7:
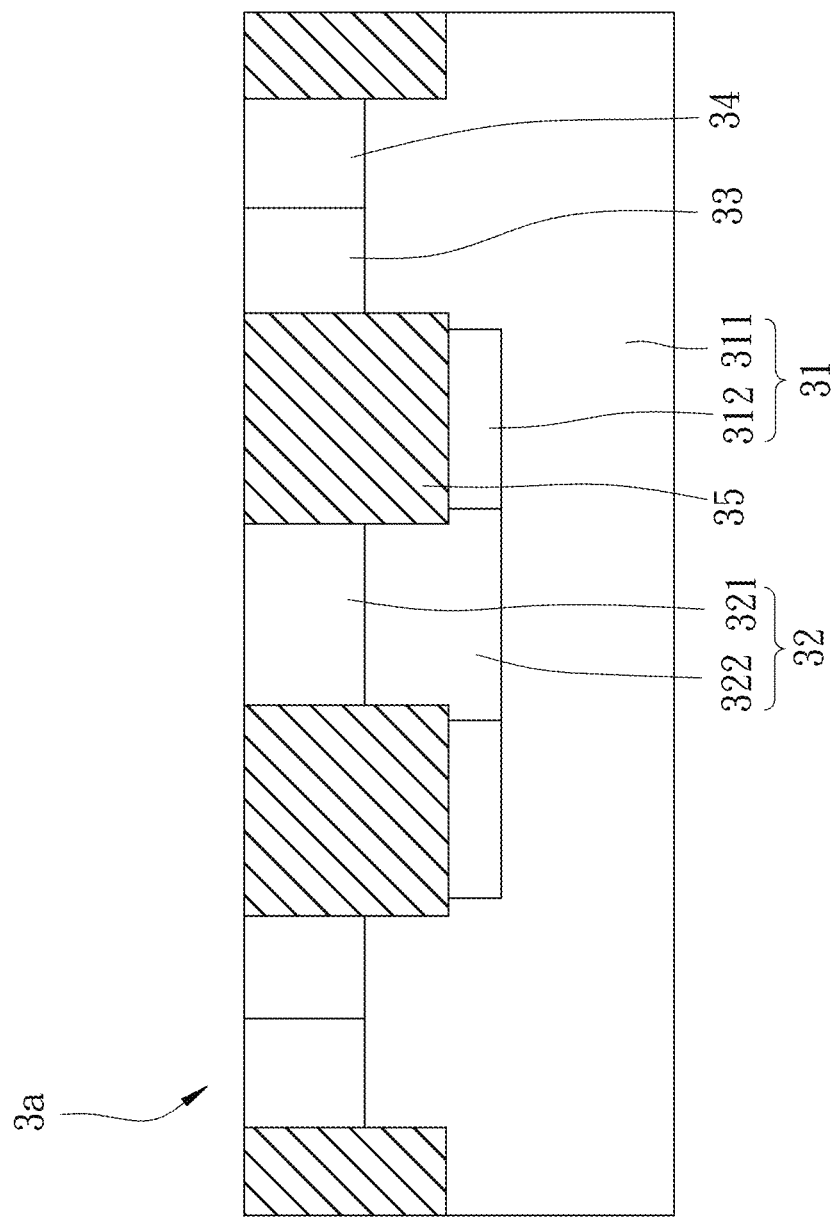
FIG. 7 is a schematic cross sectional view showing a first variation of the semiconductor device of the first preferred embodiment.

FIG. 7 illustrates a first variation of the semiconductor device (3a), wherein the substrate 31 includes a main body region 311, and a fourth doped region 312 having an impurity doping concentration higher than that of the main body region 311. The fourth doped region 312 extends downward from a bottom side of the insulating spacer block 35, and is disposed between the first and second doped regions 32, 33. An impurity doping concentration of the fourth doped region 312 can be adjusted based on an electrical signal required by the main circuit 100 and an affordable electrostatic voltage by the main circuit 100.

Figure 8:
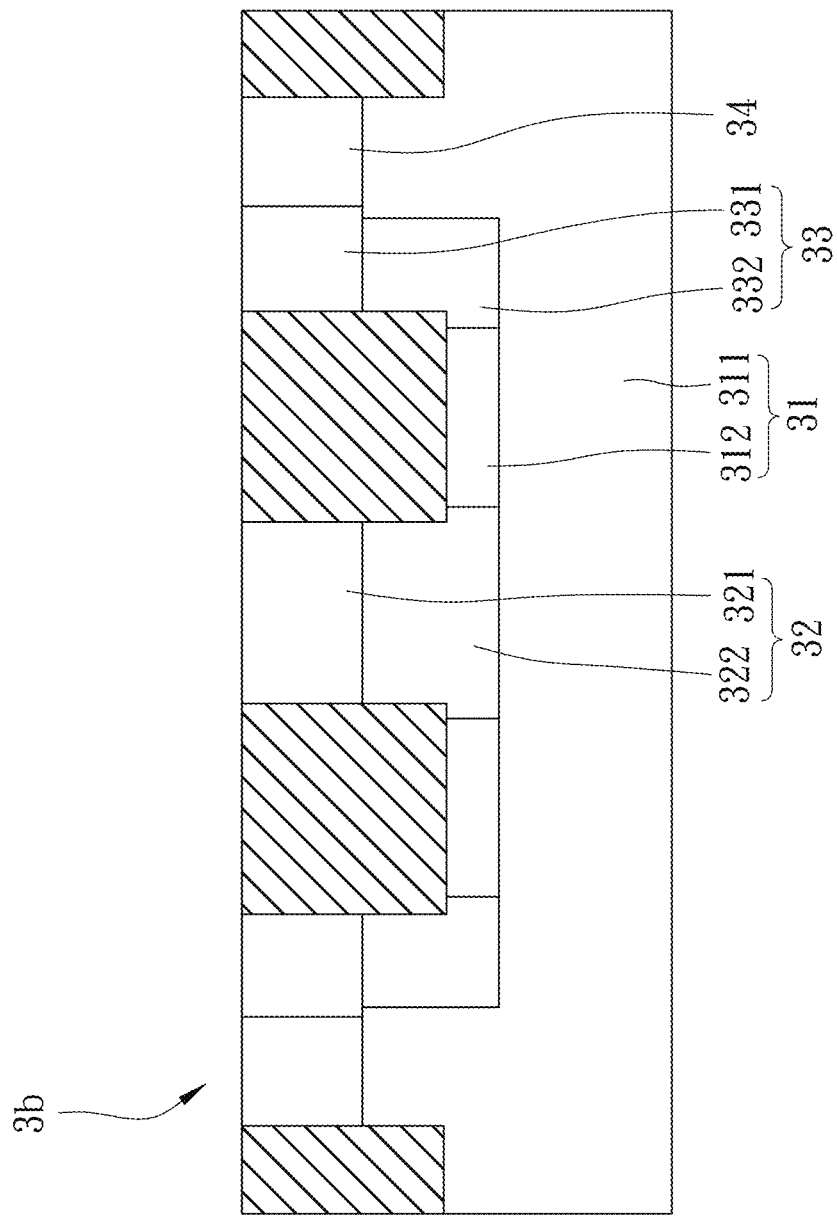
FIG. 8 is a schematic cross sectional view showing a second variation of the semiconductor device of the first preferred embodiment.

FIG. 8 illustrates a second variation of the semiconductor device (3b), which differs from the first variation of the semiconductor device (3a) of FIG. 7 in that the second doped region 33 includes an upper main doped portion 331, and a lower secondary doped portion 332 adjacent to the upper main doped portion 331 and having an impurity doping concentration lower than that of the upper main doped portion 331. As a result, since the upper main doped portion 331 with the higher impurity doping concentration does not contact the substrate 31, generation of a larger parasitic depletion capacitance can be avoided.

Figure 9:
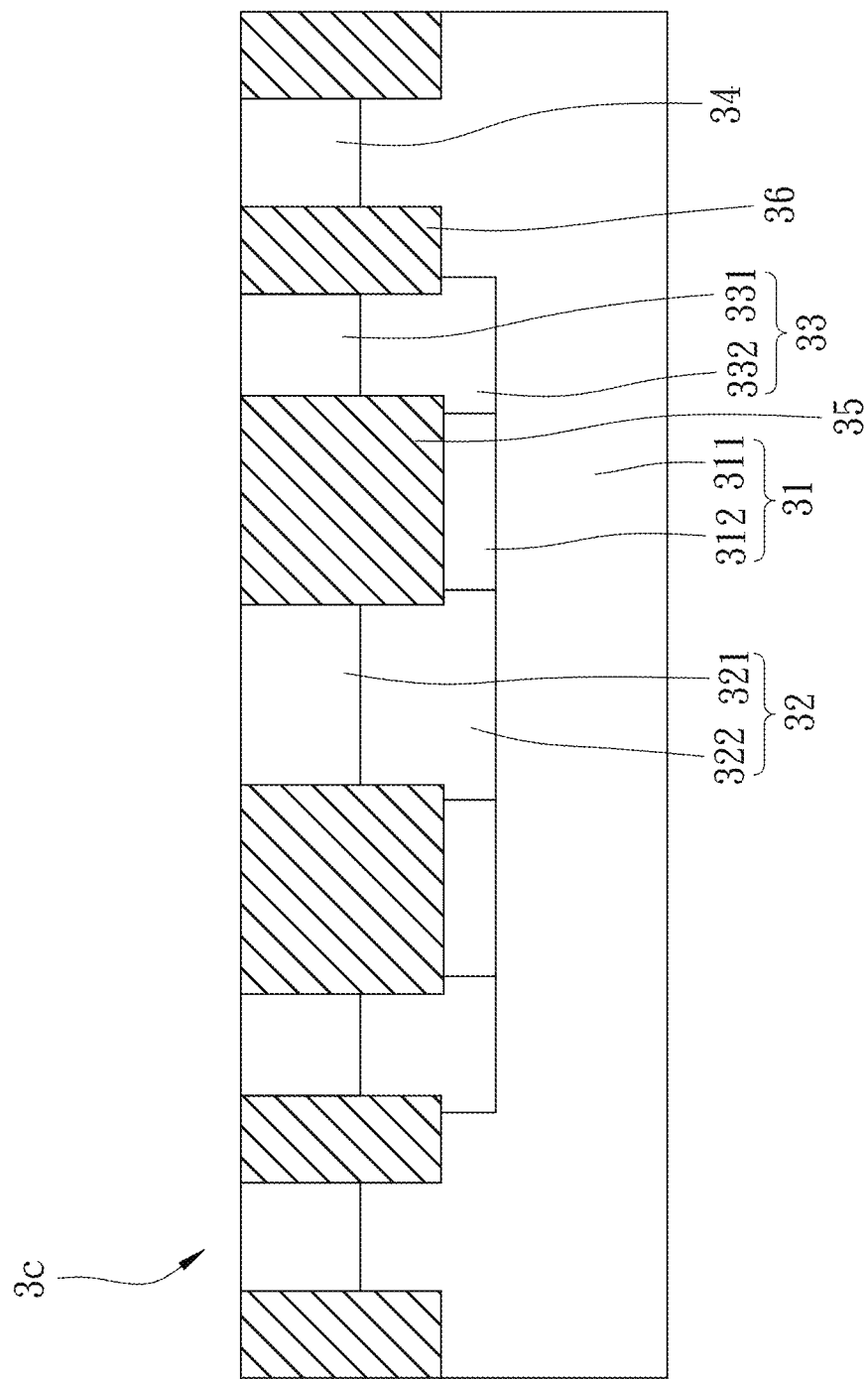
FIG. 9 is a schematic cross sectional view showing a third variation of the semiconductor device of the first preferred embodiment.
Figure 10:
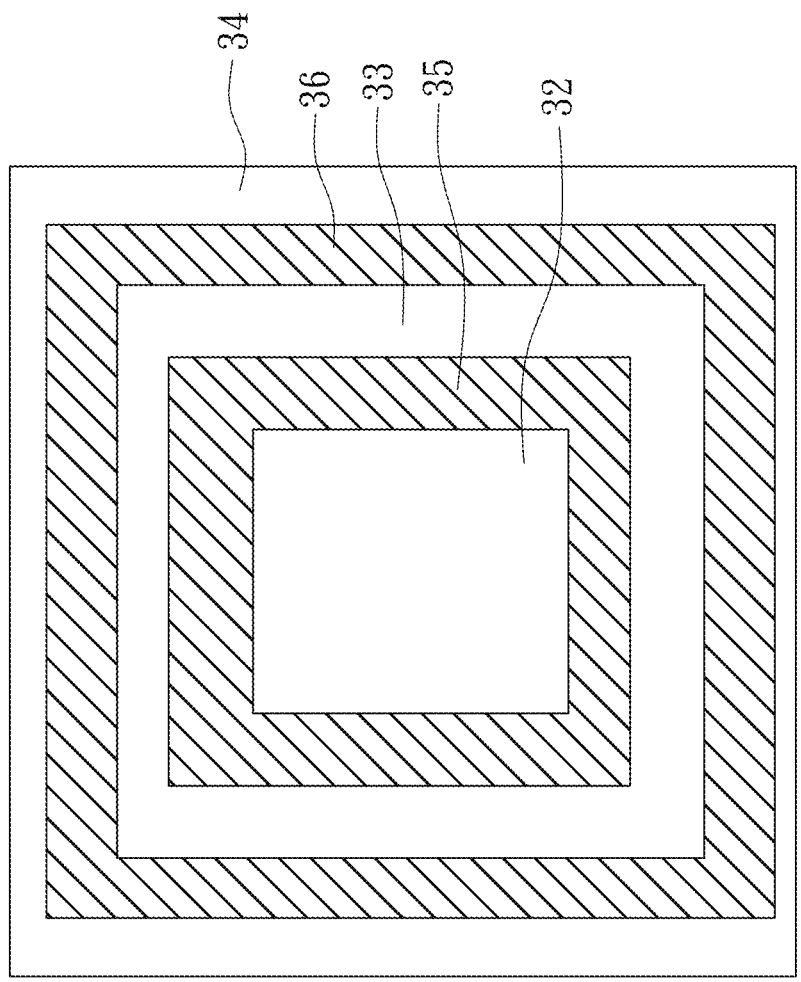
FIG. 10 is a schematic top view showing the third variation of the semiconductor device of the first preferred embodiment.

FIGS. 9 and 10 illustrate a third variation of the semiconductor device (3c), which differs from the second variation of the semiconductor device (3b) of FIG. 8 in that an insulating spacer block 36 is further formed in the substrate 32. The insulating spacer block 36 extends downward from the top surface of the substrate 31 for spacing the second and third doped regions 33, 34 apart from each other. The insulating spacer block 36 is made from the same material as that of the insulating spacer block 35. In this case, the insulating spacer block 36 surrounds the second doped region 33, and the third doped region 34 surrounds the insulating spacer block 36, as shown in FIG. 10.

Figure 11:
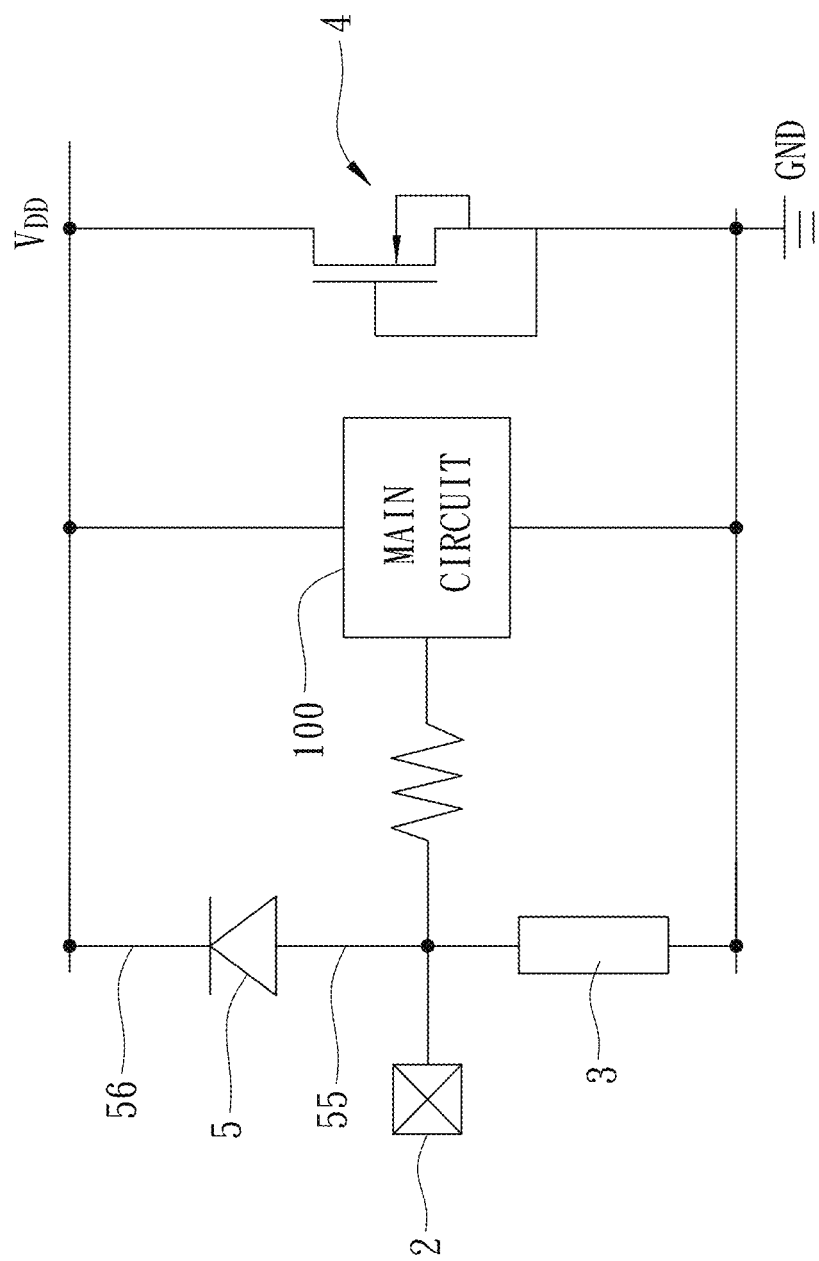
FIG. 11 is an equivalent circuit diagram illustrating the second preferred embodiment of an electrostatic discharge protection circuit for a main circuit according to the present invention.
Figure 12:
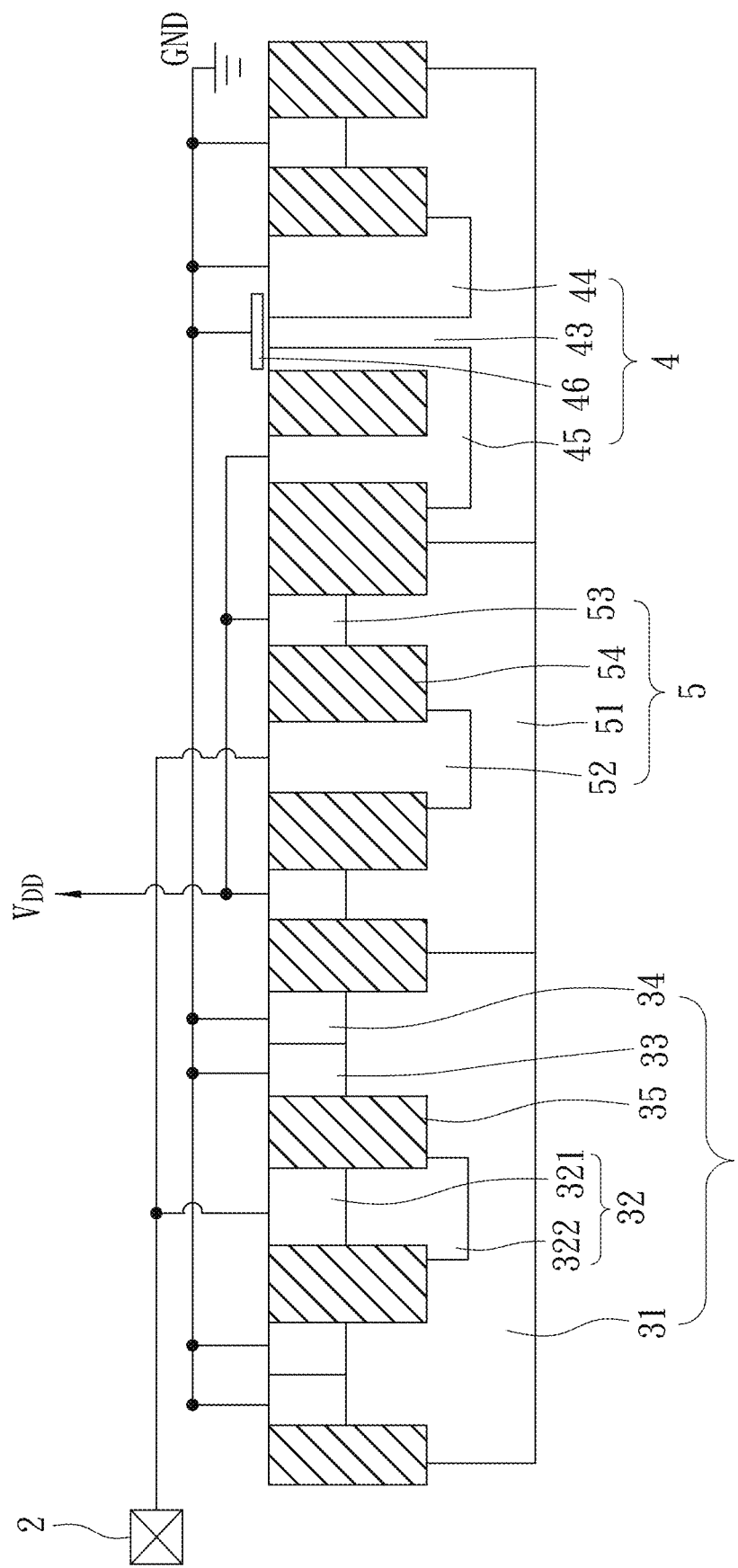
FIG. 12 is a schematic cross sectional view illustrating the second preferred embodiment.

FIGS. 11 and 12 illustrate the second preferred embodiment of an electrostatic discharge protection circuit according to this invention, which is a modification of the first preferred embodiment. Unlike the previous embodiment, the electrostatic discharge protection circuit further includes a diode 5 that has an anode 55 adapted to be connected electrically to the input/output pad 2, and a cathode adapted to be connected electrically to the power source ($V_{DD}$). More specifically, as shown in FIG. 12, the diode 5 includes an n-type well region 51, spaced apart p-type and n-type doped regions 52, 53 formed in the n-type well region 51, and an insulating spacer block 54 formed in the n-type well region 51 for spacing the p-type and n-type doped regions 52, 53 apart from each other. The p-type doped region 52 is connected electrically to the input/output pad 2. The n-type doped region 53 is connected electrically to the power source ($V_{DD}$).

In this embodiment, when the electrostatic accumulated voltage is greater than the positive first threshold voltage and a sum of a conduction voltage of the diode 55 and a conduction voltage of the equivalent n-type bipolar transistor of the n-type FET 4, the electrostatic discharge protection circuit of the present invention can provide two electrostatic discharge paths, one of which is provided by the semiconductor device 3 and consists of the first doped region 32, the substrate 31 and the second doped region 33, and the other one of which consists of the diode 55 and the equivalent n-type bipolar transistor of the n-type FET 4. Therefore, an increased electrostatic discharge speed is attained.

Figure 13:
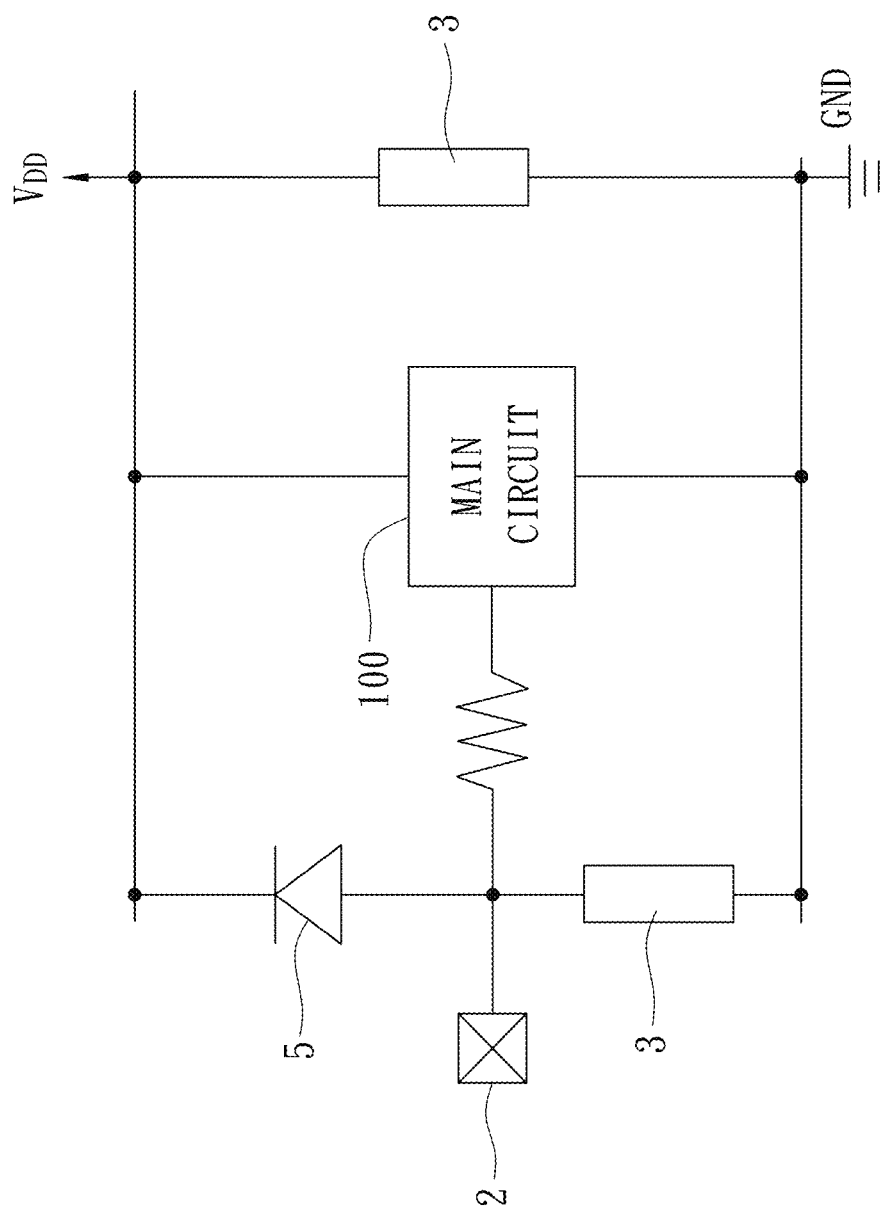
FIG. 13 is an equivalent circuit diagram illustrating the third preferred embodiment of an electrostatic discharge protection circuit for a main circuit according to the present invention.

FIG. 13 illustrates the third preferred embodiment of an electrostatic discharge protection circuit according to this invention, which is a modification of the second preferred embodiment. In this embodiment, the clamp unit includes the semiconductor device 3, i.e., the n-type FET 4 in the second preferred embodiment is replaced by the semiconductor device 3. Thus, when the electrostatic accumulated voltage is greater than a sum of the conductive voltage of the diode 5 and the positive first threshold voltage, an additional electrostatic discharge current is drained by flowing through the diode 5 and the semiconductor device 3 serving as the clamp unit.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A semiconductor device comprising:
   a substrate;
   a first doped region formed in said substrate and adapted to receive an external voltage;
   a second doped region formed in said substrate and connected to ground; and
   a third doped region formed in said substrate and connected to ground;
   each of said substrate and said third doped region being doped with a first type dopant, and each of said first and second doped regions being doped with a second type dopant such that said semiconductor device is configured to have a first threshold voltage for forward conduction between said first and second doped regions, and a second threshold voltage for forward conduction between said first and third doped regions;
   wherein, when said first type dopant and said second type dopant are respectively a p-type dopant and an n-type dopant,
      if the external voltage is greater than the first threshold voltage, a current is drained by flowing through said first doped region, said substrate and said second doped region, and
      if the external voltage is less than the second threshold voltage, a current is drained by flowing through said third doped region, said substrate and said first doped region; and
   wherein, when said first type dopant and said second type dopant are respectively an n-type dopant and a p-type dopant,
      if the external voltage is less than the first threshold voltage, a current is drained by flowing through said second doped region, said substrate and said first doped region, and
      if the external voltage is greater than the second threshold voltage, a current is drained by flowing through said first doped region, said substrate and said third doped region.

2. The semiconductor device as claimed in claim 1, further comprising an insulating spacer block formed in said substrate and extending downward from a top surface of said substrate for spacing said first and second doped regions apart from each other.

3. The semiconductor device as claimed in claim 2, wherein said substrate includes a main body region, and a fourth doped region having an impurity doping concentration higher than that of said main body region, extending downward from a bottom side of said insulating spacer block and disposed between said first and second doped regions.

4. The semiconductor device as claimed in claim 1, wherein said first doped region includes an upper main doped portion, and a lower secondary doped portion adjacent to said upper main doped portion and having an impurity doping concentration lower than that of said upper main doped portion.

5. The semiconductor device as claimed in claim 1, wherein said second doped region includes an upper main doped portion, and a lower secondary doped portion adjacent to said upper main doped portion and having an impurity doping concentration lower than that of said upper main doped portion.

6. The semiconductor device as claimed in claim 1, further comprising an insulating spacer block formed in said substrate and extending downward from a top surface of said substrate for spacing said second and third doped regions apart from each other.

7. An electrostatic discharge protection circuit for a main circuit connected electrically to an input/output pad transmitting an electrical signal to/from the main circuit and to a power source providing a predetermined supply voltage, said electrostatic discharge protection circuit comprising:

a semiconductor device including
  a substrate,
  a first doped region formed in said substrate and adapted to be connected electrically to the input/output pad to receive an electrostatic accumulated voltage from the input/output pad,
  a second doped region formed in said substrate and connected to ground, and
  a third doped region formed in said substrate and connected to ground,
  each of said substrate and said third doped region being doped with a first type dopant, and each of said first and second doped regions being doped with a second type dopant such that said semiconductor device is configured to have a first threshold voltage for forward conduction between said first and second doped regions, and a second threshold voltage for forward conduction between said first and third doped regions; and
a clamp unit adapted to be coupled between the power source and ground for prohibiting conduction between the power source and ground;
wherein, when said first type dopant and said second type dopant are respectively a p-type dopant and an n-type dopant,
  if the electrostatic accumulated voltage is greater than the first threshold voltage, an electrostatic discharge current is drained by flowing through said first doped region, said substrate and said second doped region of said semiconductor device, and
  if the electrostatic accumulated voltage is less than the second threshold voltage, an electrostatic discharge current is drained by flowing through said third doped region, said substrate and said first doped region of said semiconductor device; and
wherein, when said first type dopant and said second type dopant are respectively an n-type dopant and a p-type dopant,
  if the electrostatic accumulated voltage is less than the first threshold voltage, an electrostatic discharge current is drained by flowing through said second doped region, said substrate and said first doped region of said semiconductor device, and
  if the electrostatic accumulated voltage is greater than the second threshold voltage, an electrostatic discharge current is drained by flowing through said first doped region, said substrate and said third doped region of said semiconductor device.

8. The electrostatic discharge protection circuit as claimed in claim 7, wherein said semiconductor device further includes an insulating spacer block formed in said substrate and extending downward from a top surface of said substrate for spacing said first and second doped regions apart from each other.

9. The electrostatic discharge protection circuit as claimed in claim 8, wherein said substrate of said semiconductor device includes a main body region, and a fourth doped region having an impurity doping concentration higher than that of said main body region, extending downward from a bottom side of said insulating spacer block and disposed between said first and second doped regions.

10. The electrostatic discharge protection circuit as claimed in claim 7, wherein said first doped region of said semiconductor device includes an upper main doped portion adapted to be connected electrically to the input/output pad, and a lower secondary doped portion adjacent to said upper main doped portion and having an impurity doping concentration lower than that of said upper main doped portion.

11. The electrostatic discharge protection circuit as claimed in claim 7, wherein said second doped region of said semiconductor device includes an upper main doped portion adapted to be connected to ground, and a lower secondary doped portion adjacent to said upper main doped portion and having an impurity doping concentration lower than that of said upper main doped portion.

12. The electrostatic discharge protection circuit as claimed in claim 7, wherein said semiconductor device further includes an insulating spacer block formed in said substrate and extending downward from a top surface of said substrate for spacing said second and third doped regions apart from each other.

13. The electrostatic discharge protection circuit as claimed in claim 7, further comprising a diode having an anode adapted to be connected electrically to the input/output pad, and a cathode adapted to be connected electrically to the power source.

* * * * *